United States Patent [19]
Loboda et al.

[11] Patent Number: 5,415,126
[45] Date of Patent: May 16, 1995

[54] METHOD OF FORMING CRYSTALLINE SILICON CARBIDE COATINGS AT LOW TEMPERATURES

[75] Inventors: Mark J. Loboda, Midland, Mich.; Ji-Ping Li, Cincinnati, Ohio; Andrew J. Steckl, Cincinnati, Ohio; Chong Yuan, Cincinnati, Ohio

[73] Assignee: Dow Corning Corporation, Midland, Mich.

[21] Appl. No.: 106,665

[22] Filed: Aug. 16, 1993

[51] Int. Cl.6 .................................. C30B 25/10
[52] U.S. Cl. .......................... 117/88; 117/97; 427/450; 427/249; 437/100
[58] Field of Search ............. 156/610, 612, 613, 614, 156/DIG. 64; 427/38, 39; 437/100; 117/88, 89, 90, 97

[56] References Cited

U.S. PATENT DOCUMENTS

| | | | |
|---|---|---|---|
| 4,983,538 | 1/1991 | Goton | 437/100 |
| 4,984,534 | 1/1991 | Ito et al. | 118/723 |
| 4,985,227 | 1/1991 | Ito et al. | 423/446 |
| 5,011,706 | 4/1991 | Tarhay et al. | 427/39 |
| 5,180,571 | 1/1993 | Hosoya et al. | 423/446 |

OTHER PUBLICATIONS

Johnson et al., Mat. Res. Soc. Symp. Proc., Nov. 1992.
Learn et al., Appl. Phys. Let., vol. 17, No. 1, Jul. 1970
Steckl and Li, IEEE Transactions on Electronic Devices, vol. 39, No. 1, Jan. 1992.
Takahashi et al., J. Electrochem. Soc., vol. 139, No. 12, Dec. 1992.
Golecki et al., Appl. Phys. Lett, 60(14), Apr. 1992.
Larkin et al., Mat. Res. Soc. Symp. Proc. 204, 141 (1991).

*Primary Examiner*—R. Bruce Breneman
*Assistant Examiner*—Felisa Garrett
*Attorney, Agent, or Firm*—Roger E. Gobrogge

[57] ABSTRACT

A method of forming crystalline silicon carbide films is disclosed. The method comprises a chemical vapor deposition process in which a substrate is heated to a temperature above about 600° C. in the presence of a silicon containing cyclobutane gas.

18 Claims, 1 Drawing Sheet ns5,415,126

METHOD OF FORMING CRYSTALLINE SILICON CARBIDE COATINGS AT LOW TEMPERATURES

BACKGROUND OF THE INVENTION

The present invention relates to the growth of crystalline silicon carbide films at low temperatures using silicon containing cyclobutanes as the source gas in a chemical vapor deposition (CVD) process.

Crystalline silicon carbide is useful in many high temperature, high power and high frequency semiconductor device applications because of properties such as a wide bandgap, high saturated electron drift velocity, high breakdown electric field, high thermal conductivity, and good chemical resistance. However, most all device fabrication processes require the formation of single crystal silicon carbide films. Normally, these films are grown by chemical vapor deposition at temperatures above 1000° C. For instance, Learn et al., Appl. Phys. Let., Vol. 17, No. 1, July 1970, teach the formation of cubic silicon carbide on alpha (6H) and beta (3C) silicon carbide substrates by the reactive evaporation or reactive sputtering of silicon in acetylene at temperatures as low as 1100° C. Similarly, Steckl and Li, IEEE Transactions on Electronic Devices, Vol. 39, No. 1, Jan. 1992, teach the formation of beta (3C) silicon carbide films on carbonized silicon (100) by rapid thermal chemical vapor deposition of silane and propane at 1100°–1300° C.

Other investigators have also demonstrated the deposition of 3C silicon carbide films from organosilicon precursors at elevated temperatures. For instance, Takahashi et al., J. Electrochem. Soc., Vol 139, No. 12, Dec. 1992, teach the formation of 3C silicon carbide on Si(100) and Si(111) substrates (with and without a carbonized layer) by atmospheric pressure chemical vapor deposition using hexamethyldisilane and hydrogen gas mixtures at temperatures of 1100° C.

Golecki et al., Appl. Phys. Lett, 60 (14), April 1992, teach the formation of cubic silicon carbide on silicon (100) substrates by low pressure chemical vapor deposition using methylsilane at substrate temperatures as low as 750° C. The process described therein, however, is solely limited to the use of methylsilane as the precursor gas.

The use of silicon containing cyclobutanes to form amorphous or polycrystalline silicon carbide films is also known in the art. For instance, Tarhay et al. in U.S. Pat. No. 5,011,706, teach the formation of amorphous silicon carbide coatings by low temperature plasma enhanced chemical vapor deposition using a silicon containing cyclobutane. Similarly, Larkin et al., Mat. Res. Soc. Symp. Proc. 204, 141 (1991) teach the formation of polycrystalline silicon carbide films on silicon (100) substrates by low temperature chemical vapor deposition using substituted 1,3-disilacylobutanes. Likewise, Johnson et al., Mat. Res. Soc. Symp. Proc (November 1992) teach the formation of amorphous silicon carbide films by the thermal decomposition of silacyclobutane at temperatures in the range of 650°–1050° C. As is evident from the above descriptions, however, neither of these references teach the formation of crystalline silicon carbide.

The present inventors have now discovered that crystalline silicon carbide films can be deposited at relatively low temperatures using silicon containing cyclobutanes in a chemical vapor deposition process.

SUMMARY OF THE INVENTION

The present invention relates to a method of forming a crystalline silicon carbide film on a silicon substrate. The process comprises first growing a thin silicon carbide film on the silicon substrate by reacting it with a hydrocarbon gas ('carbonization'). The silicon substrate having the thin silicon carbide film is then heated to a temperature above 600° C. and exposed to silicon-containing cyclobutane gas to thereby deposit the crystalline silicon carbide film.

The present invention also relates to a method of forming crystalline silicon carbide films on a silicon carbide substrate. The process comprises heating the silicon carbide substrate to a temperature above 600° C. and exposing the heated substrate to silicon containing cyclobutane gas to thereby deposit the crystalline silicon carbide film.

DETAILED DESCRIPTION OF THE INVENTION

Figure 1:
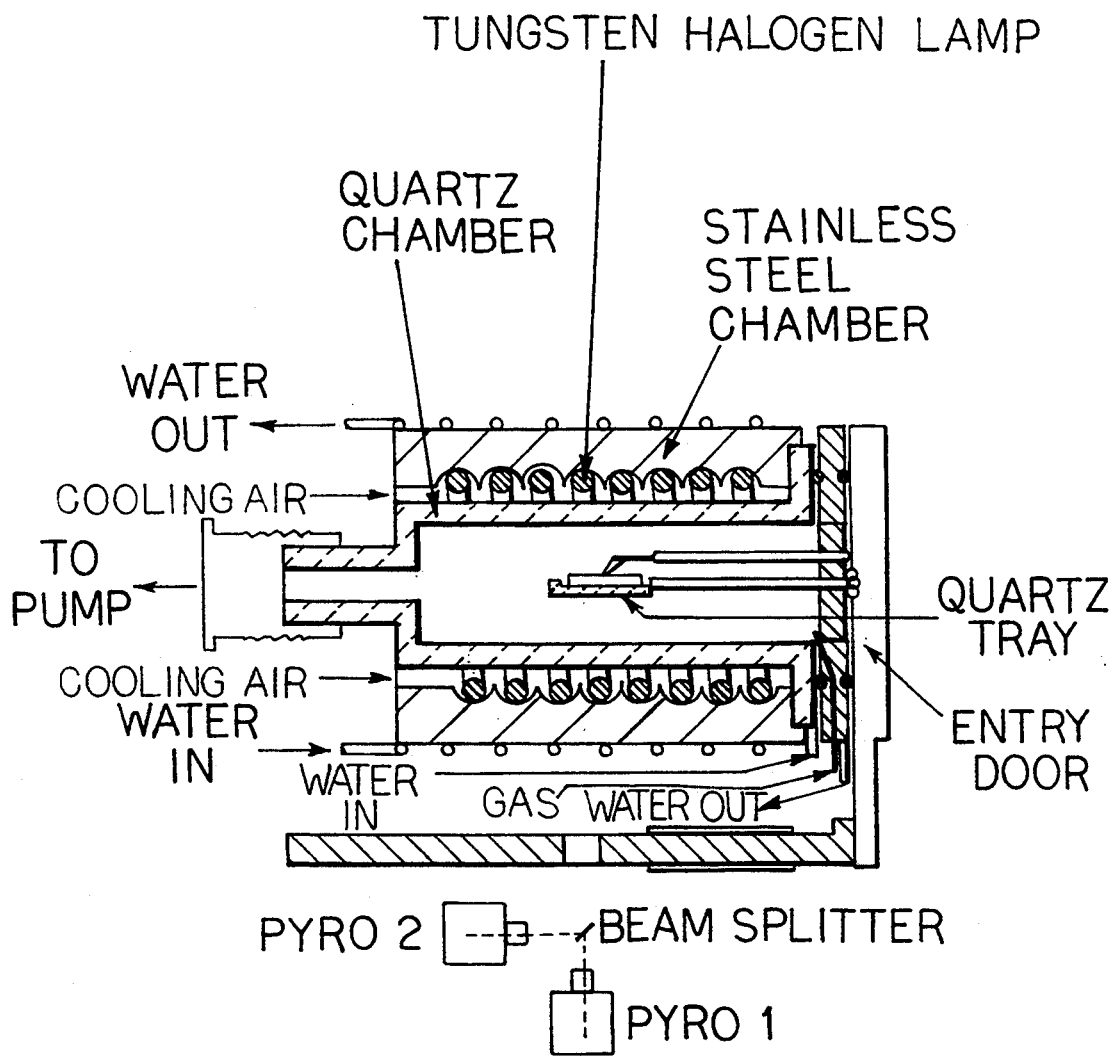
FIG. 1 is a representative reaction chamber used for depositing the silicon carbide film.

The present invention is based on the unexpected discovery that crystalline silicon carbide (SiC) films can be grown at low temperatures (eg., between 600° and 1000° C.) using silicon containing 0 cyclobutane gas.

The substrates used in the process of the present invention generally comprise either a single crystal silicon carbide substrate or a single crystal silicon wafer. Such substrates are commercially available. The first step in the process of the invention is, generally, cleaning the desired substrate. This cleaning provides a pristine crystalline surface to insure epitaxial growth. Obviously, however, if such a surface is available the additional cleaning is not necessary. Nearly any method which provides the desired clean surface can be used and many of these methods are known in the art. For instance, the substrate can be etched by dipping in an acid such as HF. Alternatively, the substrate can be etched in a corrosive atmosphere such as HCl/H2 at elevated temperatures (eg., >1000° C.).

If a silicon substrate is used, a thin buffer layer of silicon carbide is then grown on the cleaned surface. Again, processes for growing these layers are known in the art and nearly any which provides the desired silicon carbide layer can be used. One example of such a process involves exposing the silicon to a hydrocarbon gas ("carbonization") at elevated temperatures (eg., >1000° C.) under atmospheric or low pressure conditions. Hydrocarbons such as methane, ethane, propane, butane, ethylene, acetylene and the like may all be used. Specific examples of such processes include directing a stream of gas comprising propane diluted in H2 (at a flow rate of 9 sccm) and H2 (at a flow rate of 0.9 lpm) at the substrate under atmospheric pressure at 1300° C. to produce a 25 nanometer SiC layer in 1 minute. Another example of such a process include directing a stream of gas comprising propane (at a flow rate of 99 sccm) and H2 (at a flow rate of 0.9 lpm) at the substrate under 5 Torr at 1300° C. to produce a 120 nanometer SiC layer in 1 minute. If a silicon carbide substrate is used, it is not necessary to form the above layer.

The crystalline silicon carbide layers are then formed on the substrates by a standard chemical vapor deposition process in which the substrate is heated to the desired temperature in a deposition chamber followed by exposing the substrate to a silicon containing cyclobutane gas. Substrate temperatures above about 600° C. are useful herein with temperatures in the range of about 600° to about 1200° C. being preferred. More preferred are temperatures in the range of about 600° to about 1000° C.

The time necessary for the formation of the films varies depending on the concentration of silicon containing cyclobutane and the desired film thickness. Generally, exposure times of 1–30 minutes are sufficient.

The source gases used in the process of the present invention are silicon-containing cyclobutanes. More specifically the source gases are cyclobutanes in which one or more of the carbon atoms of the ring have been replaced by silicon atoms, provided enough carbon remains to form the SiC. Cyclobutanes with one silicon atom include silacyclobutanes represented by the formula

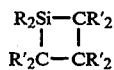

where each R is independently selected from the group consisting of hydrogen, fluorine, and hydrocarbon radicals having 1 to 4 carbon atoms and each R' is independently selected from the group consisting of hydrogen and hydrocarbon radicals having 1 to 4 carbon atoms. For example, useful silacyclobutanes include the parent compound silacyclobutane ($H_2SiC_3H_6$) and derivatives such as 1,1-difluorosilacyclobutane, 1-methylsilacyclobutane, 1,1-dimethylsilacyclobutane, 1,1-ethylmethylsilacyclobutane, 1-butylsilacyclobutane, 2,4-dimethylsilacyclobutane, 3,3-diethylsilacyclobutane, and 3,3-ethylpropylsilacyclobutane.

Cyclobutanes with two silicon atoms include 1,3-disilacyclobutanes represented by the formula

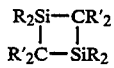

where each R and R' has the same meaning as described previously. For example, useful 1,3-disilacyclobutanes include the parent compound 1,3-disilacyclobutane and derivatives such as 1,1,3,3-tetrafluoro-1,3-disilacyclobutane, 1-methyl-1,3-disilacyclobutane, 1,3-dimethyl-1,3-disilacyclobutane, 1,1-ethylmethyl-1,3-disilacyclobutane, 1-butyl-1,3-disilacyclobutane, 2,4-dimethyl-1,3-disilacyclobutane, 2,2-diethyl-1,3-disilacyclobutane, and 2,4-ethylpropyl-1,3-disilacyclobutane.

While it should be apparent to one skilled in the art that other volatile silicon-containing cyclobutanes may function equivalently as source gases in the method of this invention, it is believed that the silacyclobutanes and 1,3-disilacyclobutanes are preferable because of their ease of handling and more ready availability.

The above silacyclobutane and 1,3-disilacyclobutane as well as their derivatives are known materials and methods for their production are known in the art. For example, the preparation of silacyclobutane from 1,1-dichlorosilacyclobutane by lithium aluminum hydride reduction is described by J. Laane, *J. Am. Chem. Soc.* 89, 1144 (1967).

The above silicon-containing cyclobutane vapor is generally diluted in the deposition chamber with an inert carrier gas. Such carriers can include, for example, hydrogen, argon and helium. Although the dilution is dependent on the rate of exposure to the substrate, generally dilutions of cyclobutane:carrier in the range of 1:1 to 1:10000 are used. Of course, mixtures of more than one of the silicon-containing cyclobutane species may also be used in the mixture.

The total pressure of the gases in the deposition chamber can be varied over a wide range and is generally controlled to a level which provides a reasonable rate of epitaxial growth. Generally, pressures in the range of about 1 torr to about atmospheric pressure are used.

The amount of chemical vapor introduced into the deposition chamber should be that which allows for a desirable SiC film growth rate. It is preferred, however, that the deposition chamber be "starved" such that nearly all of the cyclobutane in the atmosphere is deposited, thereby slowly growing the crystalline structure. Growth rates in the range of about 1–1000 nanometers/min may generally be achieved.

The process of the invention can be conducted under static conditions, but it is usually preferred to continuously introduce a controlled amount of vapor into one portion of a chamber while drawing a vacuum from another site in the chamber so as to cause flow of the vapor to be uniform over the area of the substrate.

The deposition chamber used in the process of the invention can be any which facilitates the growth of films by a chemical vapor deposition process. Examples of such chambers are described by Golecki et al. and Steckl et al., supra.

In addition, it is contemplated that the crystalline silicon carbide epitaxial growth can be assisted by a variety of processes. For instance, it is contemplated that molecular beam epitaxy, lasers and/or ion beams can be used to excite the gaseous species and, thereby, grow the epitaxial layer at lower temperatures.

The resultant films are crystalline 3C or 6H SiC. They can be grown in a wide variety of thicknesses such as from about 0.01 microns up to and exceeding 5 microns. These films exhibit transmission electron diffraction patterns consisting only of sharp spots with cubic symmetry. X-ray diffraction of these films exhibit primarily the (200) and (400) SiC lines.

The following non-limiting example is provided so that one skilled in the art may better understand the invention.

EXAMPLE 1

Four Si (100) wafers were cleaned in an $HCl/H_2$ atmosphere at 1200° C. A thin SiC film was then grown on the cleaned wafers by atmospheric pressure carbonization using a propane flow of 9 sccm and a separate $H_2$ flow of 0.9 lpm resulting in a 25 nm SiC layer. SiC films were then grown on the coated wafers using silacyclobutane at 900° and 1100° C. in the device of FIG. 1. The growth reaction is performed at 5 Torr with 1 sccm silacyclobutane and 2 lpm $H_2$ flow for 1 minute (thin layers) and 10 minutes (thick layers).

Transmission electron microscopy (TEM) and diffraction (TED) were performed on the thin films. The thin layers grown on the wafers at 900° and 1100° C. showed only single crystal material.

The thick layer grown at 900° C. showed a growth rate of 100 nm/min and was examined by conventional x-ray diffraction (theta-2 theta). The XRD shows major peaks for SiC (200) reflection at 41.44° and the SiC (400)

reflection at 89.90°. Only very small peaks were observed for SiC (111) and (220), indicating that the dominant structure is (100) with minor components of other orientations.

Four additional Si (100) wafers were cleaned in an HCl/H₂ atmosphere at 1200° C. A thin SiC film was then grown on the cleaned wafers by low pressure (5 Torr) carbonization using a propane flow of 99 sccm and a separate H₂ flow of 0.9 lpm resulting in a 120 nm SiC layer. SiC films were then grown on the coated wafers using silacyclobutane at 900° and 1100° C. in the device of FIG. 1. The growth reaction is performed at 5 Torr with 1 sccm silacyclobutane and 2 lpm H₂ flow for 1 minute (thin layers) and 10 minutes (thick layers).

Transmission electron microscopy (TEM) and diffraction (TED) were performed on the thin films. The thin layers grown on the wafers at 1100° C. showed only crystalline material. The thin layer grown at 900° C. exhibits a TED pattern which indicates a combination of crystalline and polycrystalline structures.

EXAMPLE 2

Four Si (111) wafers were cleaned in an HCl/H₂ atmosphere at 1200° C. A thin SiC film was then grown on the cleaned wafers by atmospheric pressure carbonization using a propane flow of 9 sccm and a separate H₂ flow of 0.9 lpm resulting in a 25 nm SiC layer. SiC films were then grown on the coated wafer by silacyclobutane pyrolysis at 900° and 1100° C. in the device of FIG. 1. The growth reaction is performed at 5 Torr with 1 sccm silacyclobutane and 2 lpm H₂ flow for 1 minute (thin layers) and 10 minutes (thick layers).

The thick layer grown at 900° C. yielded a growth rate of 50 nm/min and was examined by conventional x-ray diffraction (theta-2 theta). The XRD shows a very large and sharp peak at the (111) reflection (35.63°). With the exception of the second order reflection at 75.46°, no other SiC peaks are observed. This indicates that the film is monocrystalline with a (111) orientation.

That which is claimed is:

1. A method of growing an spitaxial silicon carbide film on a silicon substrate comprising:
   growing a silicon carbide buffer layer on the silicon substrate by carbonization;
   heating the silicon substrate having the silicon carbide buffer layer to a temperature in the range of about 650° to 1000° C.; and
   contacting the heated silicon substrate having the silicon carbide buffer layer with a gas comprising a silicon containing cyclobutane for a time sufficient to grow the epitaxial silicon carbide film.

2. The method of claim 1 wherein the silicon substrate is cleaned prior to growing the silicon carbide buffer layer by a method selected from the group consisting of dipping the substrate in an acid and exposing the substrate to HCl/H₂ at a temperature above about 1000° C.

3. The method of claim 1 wherein the carbonization is performed by contacting the silicon substrate with a gas mixture comprising a hydrocarbon and hydrogen gas at a temperature above about 1000° C.

4. The method of claim 3 wherein the hydrocarbon gas is selected from the group consisting of methane, ethane, propane, butane, ethylene and acetylene.

5. The method of claim 1 wherein the silicon containing cyclobutane comprises a material having the structure:

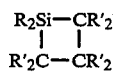

wherein each R is independently selected from the group consisting of hydrogen, fluorine, and hydrocarbon radicals having 1 to 4 carbon atoms and each R' is independently selected from the group consisting of hydrogen and hydrocarbon radicals having 1 to 4 carbon atoms.

6. The method of claim 1 wherein the silicon containing cyclobutane comprises a material having the structure:

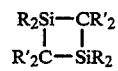

wherein each R is independently selected from the group consisting of hydrogen, fluorine, and hydrocarbon radicals having 1 to 4 carbon atoms and each R' is independently selected from the group consisting of hydrogen and hydrocarbon radicals having 1 to 4 carbon atoms.

7. The method of claim 1 wherein the gas also comprises an inert carrier gas in a ratio of cyclobutane:carrier in the range of about 1:1 to about 1:10000.

8. The method of claim 1 wherein the heated silicon substrate having the silicon carbide buffer layer is contacted with the silicon containing cyclobutane gas for a time in the range of between about 1 and about 30 minutes.

9. The method of claim 1 wherein the heated silicon substrate having the silicon carbide buffer layer is contacted with the silicon containing cyclobutane gas at a pressure in the range of between about 1 Torr and atmospheric pressure.

10. The method of claim 1 wherein growth of the epitaxial silicon carbide film is assisted by a means selected from the group consisting of molecular beam epitaxy, ion beams and lasers.

11. A method of growing an epitaxial silicon carbide film on a silicon carbide substrate comprising:
   heating the silicon carbide substrate to a temperature in the range of about 650° to 1000° C.; and
   contacting the heated silicon carbide substrate with a gas comprising a silicon containing cyclobutane for a time sufficient to grow the epitaxial silicon carbide film.

12. The method of claim 11 wherein the silicon carbide substrate is cleaned prior to growing the silicon carbide film by a method selected from the group consisting of dipping the substrate in an acid and exposing the substrate to HCl/H₂ at a temperature above about 1000° C.

13. The method of claim 11 wherein the silicon containing cyclobutane comprises a material having the structure:

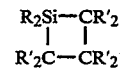

wherein each R is independently selected from the group consisting of hydrogen, fluorine, and hydrocarbon radicals having 1 to 4 carbon atoms and each R' is independently selected from the group consisting of hydrogen and hydrocarbon radicals having 1 to 4 carbon atoms.

14. The method of claim 11 wherein the silicon containing cyclobutane comprises a material having the structure:

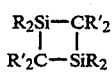

wherein each R is independently selected from the group consisting of hydrogen, fluorine, and hydrocarbon radicals having 1 to 4 carbon atoms and each R' is independently selected from the group consisting of hydrogen and hydrocarbon radicals having 1 to 4 carbon atoms.

15. The method of claim 11 wherein the gas also comprises an inert carrier gas in a ratio of cyclobutane:carrier in the range of about 1:1 to about 1:10000.

16. The method of claim 11 wherein the heated silicon carbide substrate is contacted with the silicon containing cyclobutane gas for a time in the range of between about 1 and about 30 minutes.

17. The method of claim 11 wherein the heated silicon carbide substrate is contacted with the silicon containing cyclobutane gas at a pressure in the range of between about 1 Torr and atmospheric pressure.

18. The method of claim 11 wherein growth of the epitaxial silicon carbide film is assisted by a means selected from the group consisting of molecular beam epitaxy, ion beams and lasers.

* * * * *